United States Patent
Park

(10) Patent No.: US 6,215,167 B1
(45) Date of Patent: Apr. 10, 2001

(54) POWER SEMICONDUCTOR DEVICE EMPLOYING FIELD PLATE AND MANUFACTURING METHOD THEREOF

(75) Inventor: Chan-ho Park, Incheon (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/081,832

(22) Filed: May 19, 1998

(30) Foreign Application Priority Data

May 20, 1997 (KR) .................................................. 97-19560

(51) Int. Cl.$^7$ .......................... H01L 23/58; H01L 27/082; H01L 27/102; H01L 29/70
(52) U.S. Cl. .......................... 257/488; 257/490; 257/583; 257/585; 257/587; 257/630; 257/652
(58) Field of Search ..................................... 257/576, 583, 257/587, 630, 652, 585, 593, 488, 490

(56) References Cited

U.S. PATENT DOCUMENTS

| | | | |
|---|---|---|---|
| 4,667,393 | * 5/1987 | Ferla et al. | 29/576 |
| 4,757,363 | * 7/1988 | Bohm et al. | 357/23.13 |
| 5,283,202 | 2/1994 | Pike, Jr. et al. | 31/437 |
| 5,541,439 | * 7/1996 | Mojaradi et al. | 257/488 |
| 5,898,199 | * 4/1999 | Mori et al. | 257/328 |

OTHER PUBLICATIONS

Baliga, B. Jayant, Modern Power Devices, General Electric Company, Schenectady, New York 1948, pp. 92–100.
Baliga, B. Jayant, Power Semiconductor Devices, North Carolina State University, 1995, pp. 100–102.

* cited by examiner

*Primary Examiner*—Mahshid Saadat
*Assistant Examiner*—Jesse A. Fenty
(74) *Attorney, Agent, or Firm*—Marger Johnson & McCollom, P.C.

(57) ABSTRACT

A power semiconductor device having an breakdown voltage improving structure and a manufacturing method thereof are provided. A collector region and a base region create a pn junction between them. At least one accelerating region of the same conductivity type as the collector region is formed spaced from the pn junction and at a dose higher than that of the collector region. A field plate overlaps the pn junction and the accelerating region. The field plate has an edge portion that extends past the accelerating region. When a voltage of a reverse direction is applied to the pn junction, an electric field becomes concentrated on the accelerating region as well as on the pn junction and on the edge portion of the field plate. This increases an electric field distribution area and thus also increases the breakdown voltage.

12 Claims, 5 Drawing Sheets

POWER SEMICONDUCTOR DEVICE EMPLOYING FIELD PLATE AND MANUFACTURING METHOD THEREOF

BACKGROUND OF THE INVENTION

The present invention relates to a power semiconductor device and a manufacturing method thereof, and more particularly to a power semiconductor device employing a field plate and a manufacturing method thereof.

As the scale and capacitance of appliances become large, the power semiconductor device must have a high breakdown voltage at high current. Also, to pass high current with low power consumption, the power semiconductor device requires a low saturation voltage. A high breakdown voltage characteristic is further required to withstand a high voltage of a reverse direction applied to the power device in an OFF state, and at the moment that a switch is turned off.

The breakdown voltage of the semiconductor device is determined by the size of a depletion layer of an associated pn junction. This is because most of the voltage applied to the pn junction drops across the depletion layer. It is known that a curvature in the shape of the depletion layer also affects the breakdown voltage. That is due to an electric field crowding effect, whereby an electric field is more concentrated on a portion having a curvature than on a plane portion. The effect is exacerbated at edges of the depletion layer having a high curvature. Accordingly, avalanche breakdown is more easily generated at such edges, which reduces the breakdown voltage of the entire depletion layer.

A method for dealing with this problem in the prior art is disclosed in Power Semiconductor Devices, pp. 100–102, written by B. J. Baliga, 1996. The method is by forming an insulator and a field plate on the edge portion of the depletion layer. A voltage applied to the field plate controls the surface electric potential, which in turn controls the size and shape of the depletion layer. Thus the applied voltage can improve the size and curvature of the depletion layer, and thereby increase the breakdown voltage.

The breakdown voltage of a power semiconductor device is a value obtained by integrating the electric field E in the depletion layer with respect to a horizontal length 'X' of the depletion layer. Accordingly, when the field plate voltage is applied such that it increases the length of the integrated area, the breakdown voltage increases. This happens because the electric field concentration in each curved portion of the depletion layer is reduced, which thereby prevents avalanche breakdown at each such portion.

SUMMARY OF THE INVENTION

It is an object of the present invention to provide a power semiconductor device in which an electric field distribution area is enlarged to increase a breakdown voltage.

It is another object of the present invention to provide a manufacturing method of a power semiconductor device appropriate for the above object.

A power semiconductor device according to the present invention includes a breakdown voltage improving structure. The device includes a collector region of a first conductivity type and a base region of a second conductivity type formed in the collector region. The two regions create between them a pn junction. The device also includes at least one accelerating region of the first conductivity type. The accelerating region is formed at a first predetermined distance from the base region, and at a dose higher than that of the collector region. The device further includes a field plate formed on an insulating layer. The field plate overlaps the pn junction and the accelerating region. The field plate has an edge portion that extends past the accelerating region by a second predetermined distance.

Preferably the accelerating region is formed at a dose 5–100 times as high as that of the collector region, and is in the shape of a circle surrounding the pn junction.

A method is also provided for manufacturing the device of the invention.

According to the method, a collector region of a first conductivity type is formed on a substrate. Then a first mask pattern is used for implanting a first impurity of the first conductivity type at a dose 5–100 times as high as that of the collector region. Then a second mask pattern is used for implanting a second impurity of a second conductivity type, opposite to the first conductivity type. The impurities are then diffused at high temperature to form respectively an accelerating region and a base region. The base region and the collector region create a pn junction. The accelerating region is spaced from the base by a first predetermined distance, and preferably forms a circle around the pn junction. Then an insulating layer is formed over the junction and the accelerating region. Then a field plate is formed on the insulating layer. The field plate overlaps the junction and the accelerating region, and extends past the accelerating region by a second predetermined distance.

When a voltage of a reverse direction is applied to the power semiconductor device of the invention, an electric field is concentrated on the accelerating region as well as on the pn junction and on the field plate edge. This increases an electric field distribution area and thus also increases the breakdown voltage of the device.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1A:
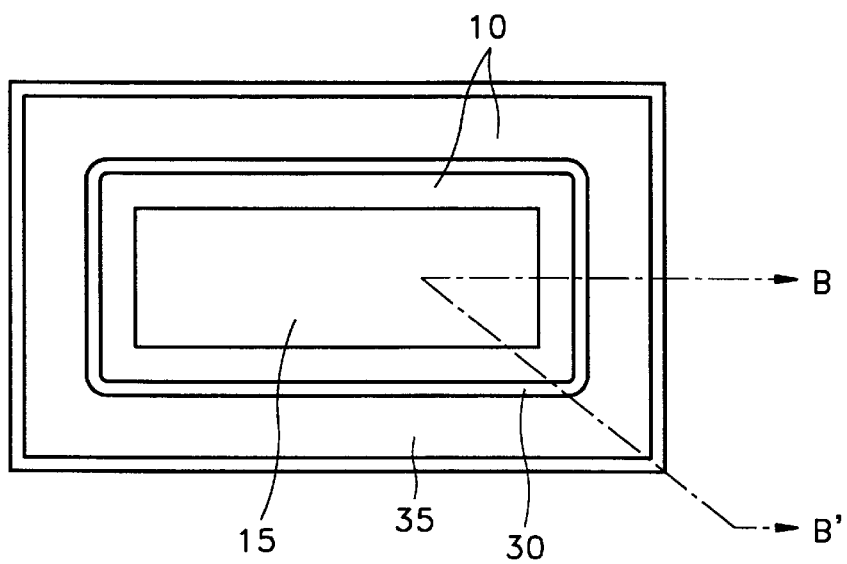
FIGS. 1A and 1B are respectively a plan view and a sectional view of a power semiconductor device according to an embodiment of the present invention.
Figure 1B:
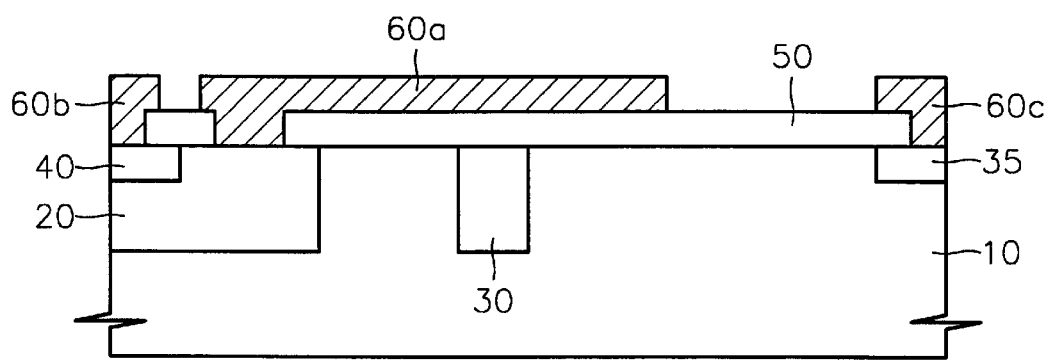

Referring to FIGS. 1A and 1B, a power semiconductor device having a breakdown voltage improving structure according to the present invention is described. A collector region a first conductivity type, e.g. n-type, is formed by doping a substrate (not shown separately). In the present description the first conductivity type is embodied as n-type, and the second conductivity type is embodied as p-type. As a person having ordinary skill in the art will discern immediately, the types can be reversed with no loss of generality.

Doping the substrate can be in one or more layers. Preferably a layer 10 of low dose n– is stacked on a layer 11 of high dose n+. The two layers form a boundary 13. For the remainder of this description, only layer 10 will be considered as the collector.

A base region 20 is formed in a second location of collector region 10. The second conductivity type is opposite the first conductivity type, e.g. p-type. Accordingly, base region 20 and collector junction 10 create between them a pn junction $j_{BC}$, shown as 15, at a third location. The pn junction forms a depletion layer (not shown).

At least one charge carrier accelerating region 30 is formed in a first location of collector region 10. The charge carrier accelerating region, also known as field accelerating region or just accelerating region, is formed at a first predetermined distance from base region 20. It is preferable that accelerating region 30 is formed of the first conductivity type, and by a doping dose 5–100 times as high as that of the collector region 10. Preferably accelerating region 30 is shaped in the form of a circle surrounding the outside of junction $j_{BC}$. The depth of region 30 influences somewhat the breakdown voltage and is preferably limited to no less than that of base region 20.

An insulating layer 50 is formed on collector region 10 out of insulating material, such as silicon oxide. Insulating layer 50 is formed overlying junction $j_{BC}$ and accelerating region 30.

A field plate 60*a* is formed on insulating layer 50 for controlling a curvature of an edge portion of the depletion layer. As seen in FIG. 1B, field plate 60*a* overlaps junction $j_{BC}$ and accelerating region 30. Field plate 60*a* has an edge portion 62 that extends past accelerating region 30 by a second predetermined distance. In the case that the accelerating region is formed by a plurality of circles, the edge portion extends past the outermost circle by the second predetermined distance.

In the embodiment of FIG. 1, field plate 60*a* functions as a base electrode. Alternately, the field plate can be implemented as an emitter electrode by an electrical connection to the later described emitter region instead. In both cases the field plate is biased by a potential and thus affects the depletion layer.

An emitter region 40 is formed in base region 20. An emitter electrode 60*b* is formed on insulating layer 50 and on emitter region 40 such that it is electrically connected to the latter.

A channel stopper 35 is preferably formed as shown to prevent generation of a channel on the top surface of collector region 10. Channel stopper 35 is of the first conductivity type, and should be formed at a dose higher than that of accelerating region 30. An electrode 60*c*, also known as an equivalent electrical potential electrode, is formed such that it is electrically connected to channel stopper 35.

As described above, when a voltage of a reverse direction is applied to junction $j_{bc}$, accelerating region 30 accommodates a disproportionately higher concentration of the horizontal electric field between the base and collector regions. This will be described with reference to FIGS. 2A and 2B, the contrast of which illustrates the result of including accelerating region 30.

Figure 2A:
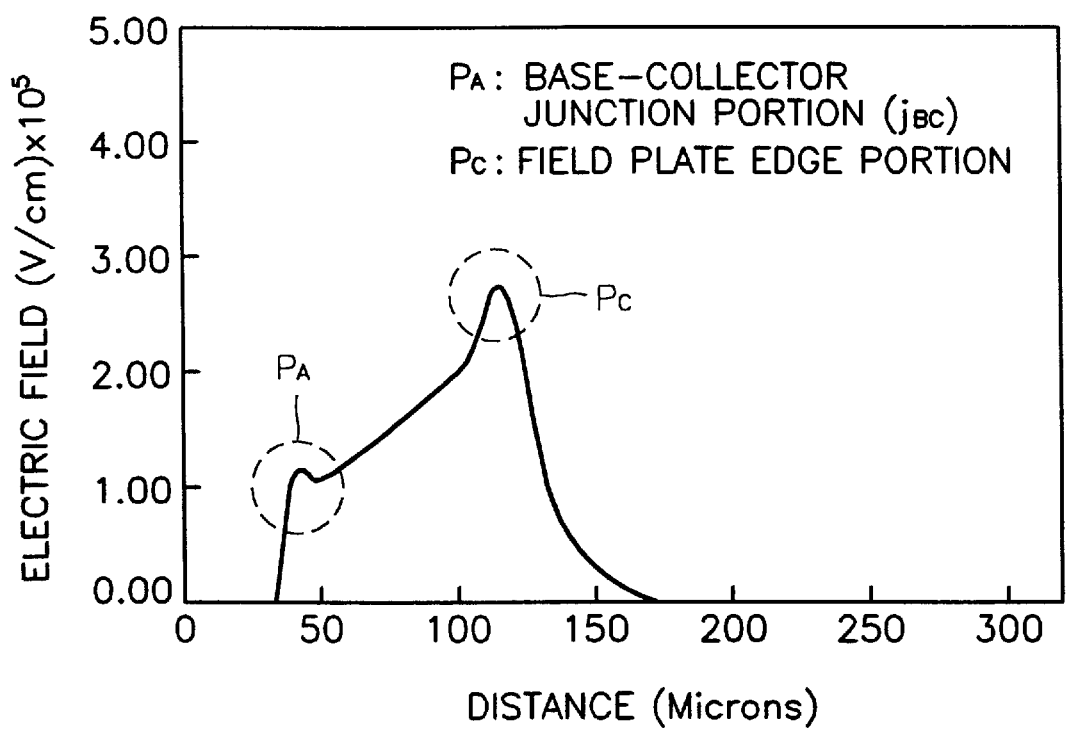
FIGS. 2A and 2B are graphs showing a simulated distribution of an electric field along a horizontal length of a depletion layer, in the respective cases where an accelerating region is not included and is included.
Figure 2B:
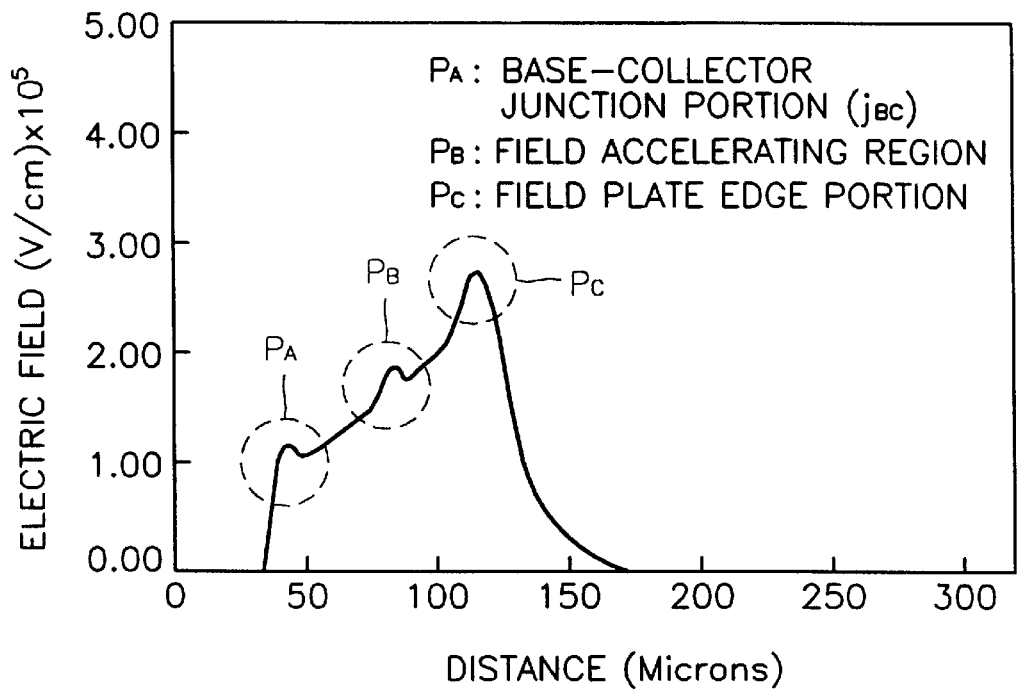

More specifically, FIGS. 2A and 2B are results of simulation analysis of the horizontal electric field distribution in a depletion layer subjected to voltage of a reverse direction. The horizontal axis represents a horizontal distance along the depletion layer, while the vertical axis represents allocation of the electric field. In each case the breakdown voltage will be found by integration of the area under the distribution curve.

FIG. 2A shows the distribution curve for the case where an accelerating region is not formed. The curve exhibits local peaks $P_A$ and $P_c$. These peaks correspond to enhanced concentration of electric field at junction $j_{BC}$ and at the edge portion of the field plate respectively.

FIG. 2B shows the distribution curve for the case where a single accelerating region 30 is formed, of the first conductivity type, and at a high dose. The same two peaks $P_A$ and $P_c$ are observed, along with a new local peak $P_B$. Peak $P_B$ corresponds to additional electric field concentration on accelerating region 30. Accordingly, the area under the distribution curve of FIG. 2B is larger than that of FIG. 2A. This corresponds to an enlarged area of the depletion layer where the electric field is distributed.

In the case where more than one accelerating regions are formed, each would give rise to a local peak similar to $P_B$. These local peaks would further enlarge the area under the distribution curve.

As the electric field distribution area is enlarged due to including the accelerating region, the breakdown voltage increases as described above. The improvement is described in more detail with reference to FIG. 3.

Figure 3:
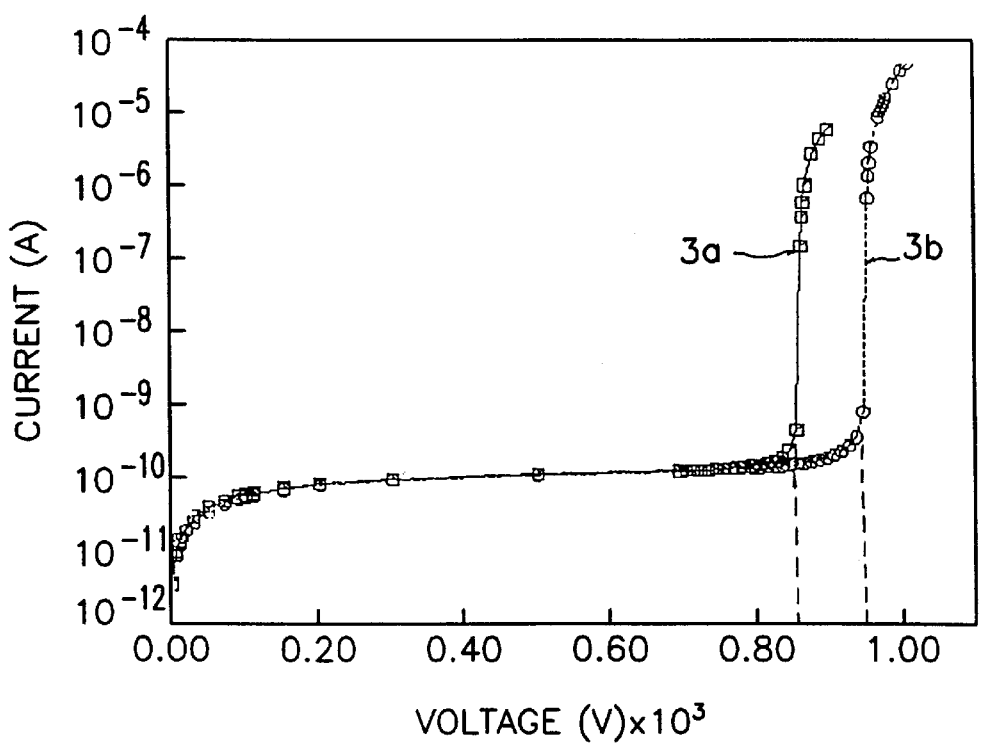
FIG. 3 is a graph showing simulated breakdown voltage characteristic lines for the electric field distributions of FIGS. 2A and 2B.

FIG. 3 shows two simulated current (I)—voltage (V) characteristic lines of the junction. Line 3*a* corresponds to the distribution curve of FIG. 2A (no accelerating region), and line 3*b* corresponds to that of FIG. 2B (accelerating region 30 included). For both lines voltage breakdown occurs at a point in which leakage current increases rapidly. For line 3*a* that is at approximately 850 V, while for line 3*b* that is at approximately 950 V. Accordingly, by forming accelerating region 30, the breakdown voltage was increased by approximately 100 V.

An embodiment of the manufacturing method of the present invention is now described with reference to FIGS. 4 through 8. First a substrate is selected, on which a collector region is formed of a first conductivity type, e.g. n-type.

Figure 4:
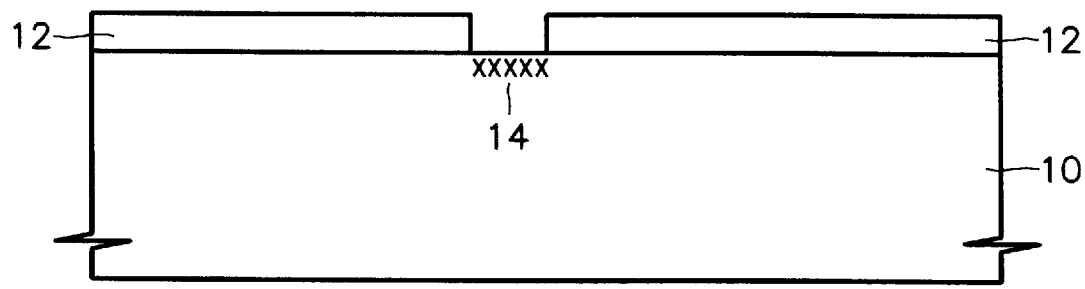
FIGS. 4 through 8 are sectional views of sequential steps of a manufacturing method of a power semiconductor device according to an embodiment of the present invention.

Referring to FIG. 4, a first mask pattern 12 is formed on collector region 10, that has an opening where an accelerating region is to be formed at a first location. The first mask pattern 12 can be formed by an insulating material such as an oxide, and preferably a thermal oxide. All mask patterns of the method of the invention open portions where special regions will be formed.

Then a first impurity 14 for forming the accelerating region is implanted in collector region 10 through first mask pattern 12. The first impurity is of the first conductivity type, and is injected at a dose approximately 5–100 times higher than that used to form collector region 10.

Figure 5:
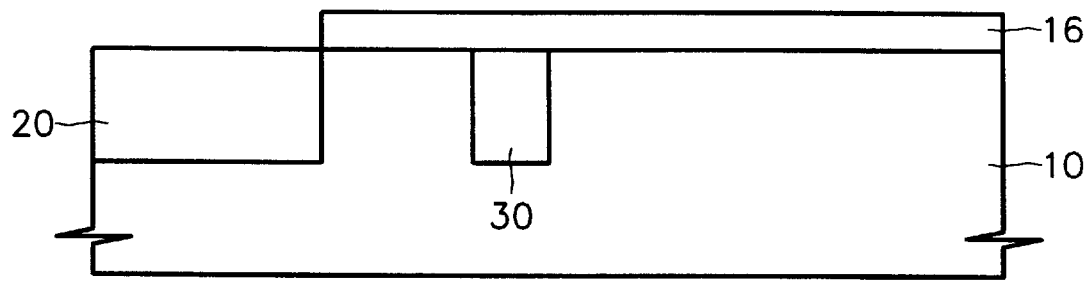

Referring to FIG. 5, a second mask pattern 16 is formed on collector region 10, that has an opening where a base region will be formed at a second location. It is preferable that second mask pattern 16 is formed of a thermal oxide layer, like first mask pattern 12 of FIG. 4. Second mask pattern 16, along with the later described third and fourth mask patterns, can all be formed by the following method. First burying, by a thermal oxidation process, the portion opened by the former mask pattern, and then repatterning the thermally oxidized mask.

Then a second impurity is implanted through second mask pattern 16 by a process such as an ion implantation process. The second impurity is of a second conductivity type, opposite to the first conductivity type, e.g. p-type.

Then a high temperature diffusion process takes place. This causes a base region 20 of a predetermined depth to be formed in collector region 10 at a third location. Base region 20 and collector region 10 create between them a pn junction $j_{BC}$. The process also diffuses first impurity 14 of FIG. 4, thereby forming an accelerating region 30 having a predetermined depth.

Preferably the first and second impurities have been implanted such that, after the diffusion process, the accelerating region 30 is spaced from base region 20 by a first predetermined distance, and is in the shape of at least one circle surrounding the pn junction.

Figure 6:
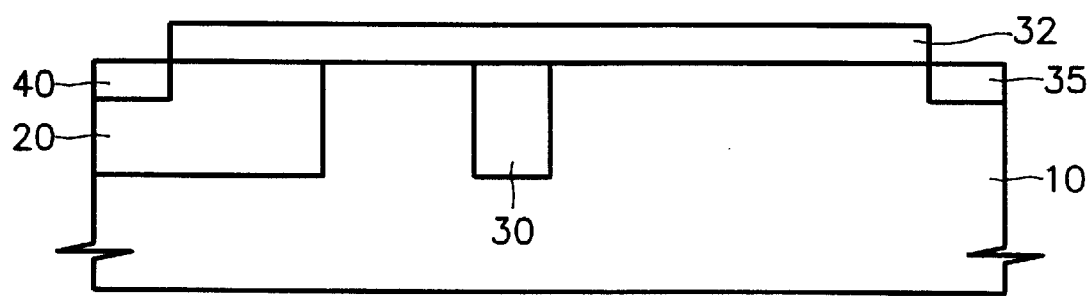

Referring to FIG. 6, a third mask pattern 32 is formed on the resultant structure, with an opening where an emitter region will be formed. Then a third impurity of the first conductivity type is implanted. Subsequently, emitter region 40 is formed through the high temperature diffusion process.

Preferably third mask pattern 32 has an additional opening for a channel stopper 35. Thus, simultaneously with forming emitter region 40, a channel stopper 35 of the first conductivity type is also formed by diffusing the third impurity also near a cut portion of the device.

Figure 7:
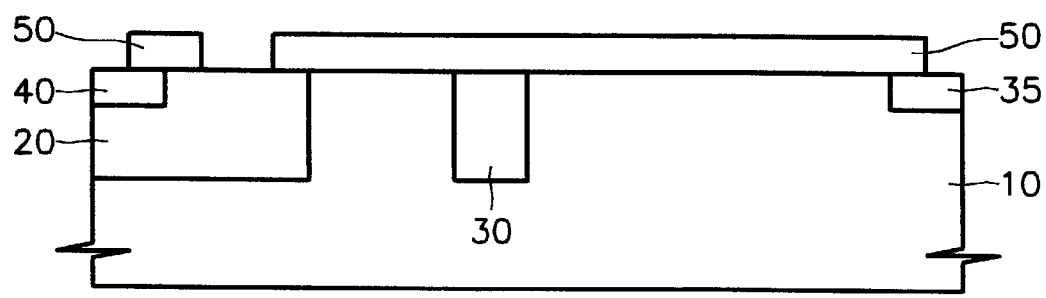

As shown in FIG. 7, a fourth mask pattern 50, also known as insulating layer 50, is formed overlying the pn junction and the accelerating region. The insulating layer has openings where electrical contacts will be made. The insulating layer thus exposes partially emitter region 40, a base region 20 and channel stopper 35.

Figure 8:
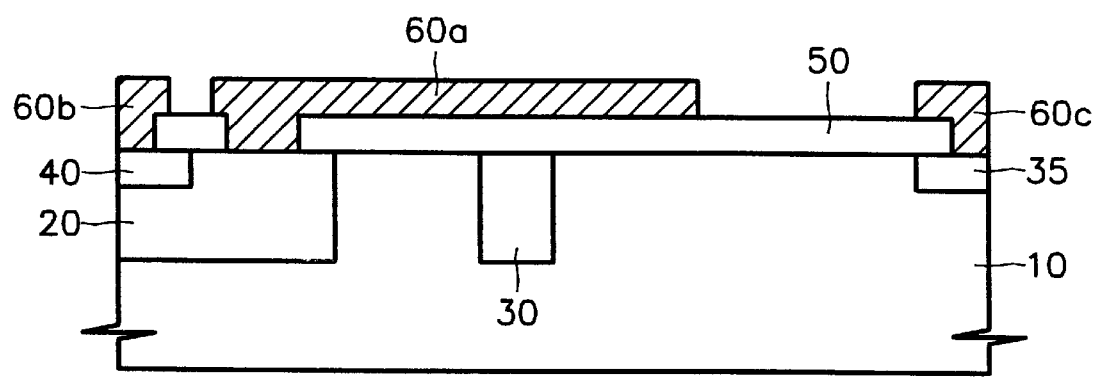

Referring to FIG. 8, a conductive material, e.g. aluminum, is deposited on the entire surface of the resultant structure. The conductive material is then patterned to form individual electrodes. In the embodiment of FIG. 8, the electrodes are an emitter electrode 60b connected to emitter region 40, a field plate 60a connected to base region 30 and functioning as a base electrode, and an equivalent electric potential electrode 60c connected to channel stopper 35. Alternately, and as described above, field plate 60a could be patterned to function as an emitter electrode.

Field plate 60a is patterned to overlap accelerating region 30. This means overlapping even the outermost circle, in the case that accelerating region 30 has been formed in a plurality of circles. Further, field plate 60a is preferably patterned to have an edge portion 62 that extends past the outermost circle by a second predetermined distance.

As a result of the process of the present invention, at least one accelerating region of the first conductivity type is formed between the pn junction and the field plate edge portion at a dose higher than that of the collector region. Accordingly, when a voltage of a reverse direction is applied to the pn junction, an electric field becomes concentrated on the accelerating region as well as on the pn junction and the field plate edge portion. This exhibits an electric field peak, and enlarges an electric field distribution area, which increases the breakdown voltage of the resulting power semiconductor device.

As described above, it should be understood that the invention is not limited to the illustrated embodiment, and that many changes and modifications can be made within the scope of the invention by a person skilled in the art.

What is claimed is:

1. A breakdown voltage improving structure in a power semiconductor device comprising:

a semiconductor substrate;

a collector region of a first conductivity type formed in the substrate;

a base region of a second conductivity type formed in the collector region, the collector region and the base region thereby forming a pn junction;

at least one accelerating region of the first conductivity type formed in the collector region at a dose higher than that of the collector region and spaced from the base region by a first predetermined distance;

an insulating layer formed on the substrate overlying the pn junction and the accelerating region; and a field plate formed on the insulating layer overlapping the pn junction and the accelerating region.

2. A structure according to claim 1, wherein the accelerating region is formed at a dose 5–100 times higher than that of the collector region.

3. A structure according to clam 1, wherein the accelerating region has a circular cylindrical shape, the accelerating region surrounding the pn junction.

4. A structure according to claim 1, wherein the field plate has an edge portion that extends past the accelerating region by a second predetermined distance.

5. A structure according to claim 1, wherein the field plate is electrically connected to the base region.

6. A structure according to claim 1, wherein the collector region is formed by stacking a layer of low dose n– on a layer of a high dose n+.

7. A structure according to claim 1, further comprising an emitter region of a first conductivity type formed in the base region.

8. A structure according to claim 7, wherein the field plate is electrically connected to the emitter region.

9. A structure according to claim 7, wherein the field plate is electrically connected to the base region.

10. A structure according to claim 1, further comprising a channel stopper region of a first conductivity type formed in the collector region at a dose higher than that of the accelerating region.

11. A structure according to claim 10, further comprising an electrode electrically connected to the channel stopper region.

12. A breakdown voltage improving structure in a power semiconductor device comprising:

a semiconductor substrate;

a collector region of a first conductivity type formed in the substrate;

a base region of a second conductivity type formed in the collector region, the collector region and the base region thereby forming at least one vertical pn junction;

at least one accelerating region of the first conductivity type formed in the collector region at a dose higher than that of the collector region and spaced from the base region by a first predetermined distance, an insulating layer formed on the substrate overlying the pn junction and the accelerating region; and a field plate formed on the insulating layer overlapping the pn junction and the accelerating region.

* * * * *

UNITED STATES PATENT AND TRADEMARK OFFICE
CERTIFICATE OF CORRECTION

PATENT NO. : 6,215,167 B1
DATED : April 10, 2001
INVENTOR(S) : Park

It is certified that error appears in the above-identified patent and that said Letters Patent is hereby corrected as shown below:

Column 3,
Line 8, "iBC" should read -- jBC --.
Line 54, "jbc" should read -- jBC --.

Column 4,
Line 9, "Pc" should read -- PC --.

Column 6,
Line 56, "distance;" should read -- distance, wherein the accelerating region surrounds the outside of the pn junction; --.
Line 20, "a circular, cylindrical shape, the accelerating region surrounding the pn junction." should read -- a cylindrical shape. --.

Signed and Sealed this

Twenty-sixth Day of November, 2002

Attest:

Attesting Officer

JAMES E. ROGAN
Director of the United States Patent and Trademark Office